United States Patent
Chindo

(10) Patent No.: US 10,992,307 B2
(45) Date of Patent: Apr. 27, 2021

(54) FREQUENCY SIGNAL GENERATION APPARATUS AND FREQUENCY SIGNAL GENERATION SYSTEM

(71) Applicant: Seiko Epson Corporation, Tokyo (JP)

(72) Inventor: Koji Chindo, Chino (JP)

(73) Assignee: Seiko Epson Corporation

( * ) Notice: Subject to any disclaimer, the term of this patent is extended or adjusted under 35 U.S.C. 154(b) by 225 days.

(21) Appl. No.: 16/181,472

(22) Filed: Nov. 6, 2018

(65) Prior Publication Data
US 2020/0028516 A1    Jan. 23, 2020

(30) Foreign Application Priority Data
Nov. 7, 2017    (JP) .............................. JP2017-214371

(51) Int. Cl.
  *H03L 7/26*     (2006.01)
  *H03B 17/00*    (2006.01)
  *G04F 5/14*     (2006.01)

(52) U.S. Cl.
  CPC .................. *H03L 7/26* (2013.01); *G04F 5/14* (2013.01); *H03B 17/00* (2013.01)

(58) Field of Classification Search
  CPC .............. H03L 7/26; H03B 17/00; G04F 5/14
  USPC ............................. 331/94.1, 3; 368/118, 156
  See application file for complete search history.

(56) References Cited

U.S. PATENT DOCUMENTS

| | | | |
|---|---|---|---|
| 6,320,472 B1 | 11/2001 | Vanier | |
| 10,056,913 B1 * | 8/2018 | Roper | ........................ G04F 5/14 |
| 10,642,226 B2 * | 5/2020 | Hayashi | .................... H03L 1/04 |
| 2005/0184815 A1 | 8/2005 | Lipp et al. | |
| 2015/0091661 A1 | 4/2015 | Chindo et al. | |
| 2015/0180487 A1 | 6/2015 | Yoshida | |
| 2015/0180492 A1 | 6/2015 | Yoshida et al. | |

FOREIGN PATENT DOCUMENTS

| | | | | |
|---|---|---|---|---|
| JP | 2010-245805 A | | 10/2010 | |
| JP | 2012-195788 A | | 10/2012 | |
| JP | 2015-070575 A | | 4/2015 | |
| JP | 2015-119443 A | | 6/2015 | |
| JP | 2015-122596 A | | 7/2015 | |
| JP | 2019160878 A | * | 9/2019 | ............. G04F 5/145 |

OTHER PUBLICATIONS

G.F. Weston, Ultrahigh Vacuum Practice, published by Butterworth & Co. Ltd., London, GB 1985 (292 pages).

S. Abdullah et al., "Aging Studies on Micro-Fabricated Alkali Buffer-Gas Cells for Miniature Atomic Clocks", Applied Physics Letters, 106,163505-1/5 (2015, pp. 1-5).

O. Kozlova et al., "Temerature Dependence of a Cs Vapor Cell Clock: Pressure Shift, Signal Amplitude, Light Shift." 2011 Conference of the IEEE International Frequency Control Symposium (FCS) Proceedings (5 pages).

* cited by examiner

*Primary Examiner* — Arnold M Kinkead
(74) *Attorney, Agent, or Firm* — Harness, Dickey & Pierce, P.L.C.

(57) ABSTRACT

A frequency signal generation apparatus includes a light source, an atom cell with gaseous alkali metal atoms and a buffer gas enclosed therein, through which light output from the light source passes, and a container with a gas containing gas molecules in common with the buffer gas enclosed, housing the atom cell, wherein pressure of the common gas molecules is substantially the same within the atom cell and within the container.

8 Claims, 8 Drawing Sheets

FREQUENCY SIGNAL GENERATION APPARATUS AND FREQUENCY SIGNAL GENERATION SYSTEM

CROSS-REFERENCE TO RELATED APPLICATIONS

This application claims priority to Japanese Patent Application No. 2017-214371, filed Nov. 7, 2017, the entirety of which is hereby incorporated by reference.

BACKGROUND

1. Technical Field

The present invention relates to a frequency signal generation apparatus and frequency signal generation system.

2. Related Art

An atomic oscillator including a light source and an atom cell in which alkali metal atoms of rubidium, cesium, or the like are enclosed, and oscillating according to energy transition of the alkali metal atoms is known as a frequency signal generation apparatus.

For example, JP-A-2015-119443 discloses an atom cell having an internal space in which metal atoms and a buffer gas are enclosed, and the buffer gas is a mixed gas containing nitrogen gas and argon gas.

However, particularly, gas molecules having a lower molecular weight have higher permeability for the wall of the atom cell. Accordingly, the gas molecules contained in the buffer gas may flow out from the atom cell or gas molecules existing outside may flow into the atom cell. Thereby, the partial pressure of the gas molecules contained in the buffer gas may change and the frequency stability may be lower.

SUMMARY

An advantage of some aspects of the disclosure is to provide a frequency signal generation apparatus in which fluctuations of partial pressure of gas molecules contained in a buffer gas can be suppressed. Another advantage of some aspects of the disclosure is to provide a frequency signal generation system in which fluctuations of partial pressure of gas molecules contained in a buffer gas can be suppressed.

The invention can be implemented as the following embodiments or application examples.

Application Example 1

A frequency signal generation apparatus according to this application example includes a light source, an atom cell with gaseous alkali metal atoms and a buffer gas enclosed therein, through which light output from the light source passes, and a container with a gas containing gas molecules in common with the buffer gas enclosed, housing the atom cell, wherein pressure of the common gas molecules is substantially the same within the atom cell and within the container.

In the frequency signal generation apparatus according to this application example, the pressure of the common gas molecules contained in the buffer gas and the gas is substantially the same within the atom cell and within the container. Accordingly, the common gas molecules contained in the buffer gas permeating the wall of the atom cell and flowing out from the atom cell and the common gas molecules contained in the gas permeating the wall of the atom cell and flowing into the atom cell can be suppressed. Thereby, in the frequency signal generation apparatus according to the application example, fluctuations of partial pressure of the gas molecules contained in the buffer gas can be suppressed.

Application Example 2

In the frequency signal generation apparatus according to the application example, the gas may contain gas molecules having lower permeability for a wall of the atom cell than the common gas molecules, and total pressure of the gas may be substantially the same as atmospheric pressure.

In the frequency signal generation apparatus according to this application example, the total pressure of the gas is substantially the same as the atmospheric pressure. Accordingly, lowering of frequency stability by a change of the shape of the container due to the difference between the total pressure of the gas and the atmospheric pressure can be suppressed.

Application Example 3

In the frequency signal generation apparatus according to the application example, the buffer gas may contain the gas molecules having lower permeability.

In the frequency signal generation apparatus according to this application example, both the buffer gas and the gas contain the gas molecules having lower permeability, and thereby, permeation of the gas molecules having lower permeability through the wall of the atom cell can be suppressed more reliably compared to the case where one of the buffer gas and the gas contains the gas molecules having lower permeability and the other does not contain the gas molecules having lower permeability.

Application Example 4

In the frequency signal generation apparatus according to the application example, pressure of the buffer gas within the atom cell may be lower than atmospheric pressure.

In the frequency signal generation apparatus according to this application example, the pressure of the buffer gas within the atom cell is lower than the atmospheric pressure. Accordingly, intensity of an EIT (Electromagnetically Induced Transparency) signal is higher.

Application Example 5

In the frequency signal generation apparatus according to the application example, the gas may contain a plurality of kinds of the common gas molecules.

In the frequency signal generation apparatus according to this application example, fluctuations of the partial pressure of the plurality of kinds of common gas molecules contained in the buffer gas can be suppressed.

Application Example 6

In the frequency signal generation apparatus according to the application example, a light receiving element that receives light transmitted through the atom cell is provided, wherein the container may house the light source and the light receiving element.

In the frequency signal generation apparatus according to this application example, the container houses the light source and the light receiving element. Accordingly, it is not necessary to provide a window for transmission of the light output from the light source in the container, and the gas permeating the window and flowing out of the container can be suppressed.

Application Example 7

In the frequency signal generation apparatus according to the application example, the common gas molecules may be of hydrogen, helium, neon, nitrogen, argon, or krypton.

In the frequency signal generation apparatus according to this application example, the common gas molecules are the above described molecules. Accordingly, in the buffer gas, lowering of the frequency stability due to collisions between the gaseous alkali metal atoms can be suppressed.

Application Example 8

A frequency signal generation system according to this application example is a frequency signal generation system including a frequency signal generation apparatus, and the frequency signal generation apparatus includes a light source, an atom cell with gaseous alkali metal atoms and a buffer gas enclosed therein, through which light output from the light source passes, and a container with a gas containing gas molecules in common with the buffer gas enclosed, housing the atom cell, wherein pressure of the common gas molecules is substantially the same within the atom cell and within the container.

In the frequency signal generation system according to this application example, the fluctuations of the partial pressure of the gas molecules contained in the buffer gas can be suppressed.

BRIEF DESCRIPTION OF THE DRAWINGS

The embodiments of the invention will be described with reference to the accompanying drawings, wherein like numbers reference like elements.

DESCRIPTION OF EXEMPLARY EMBODIMENTS

As below, embodiments of the invention will be explained in detail using the drawings. Note that the embodiments to be explained do not unduly limit the invention described in the appended Claims. Further, not all of the configurations to be explained are necessarily essential component elements of the invention.

1. Frequency Signal Generation Apparatus 1.1. Configuration

Figure 1:
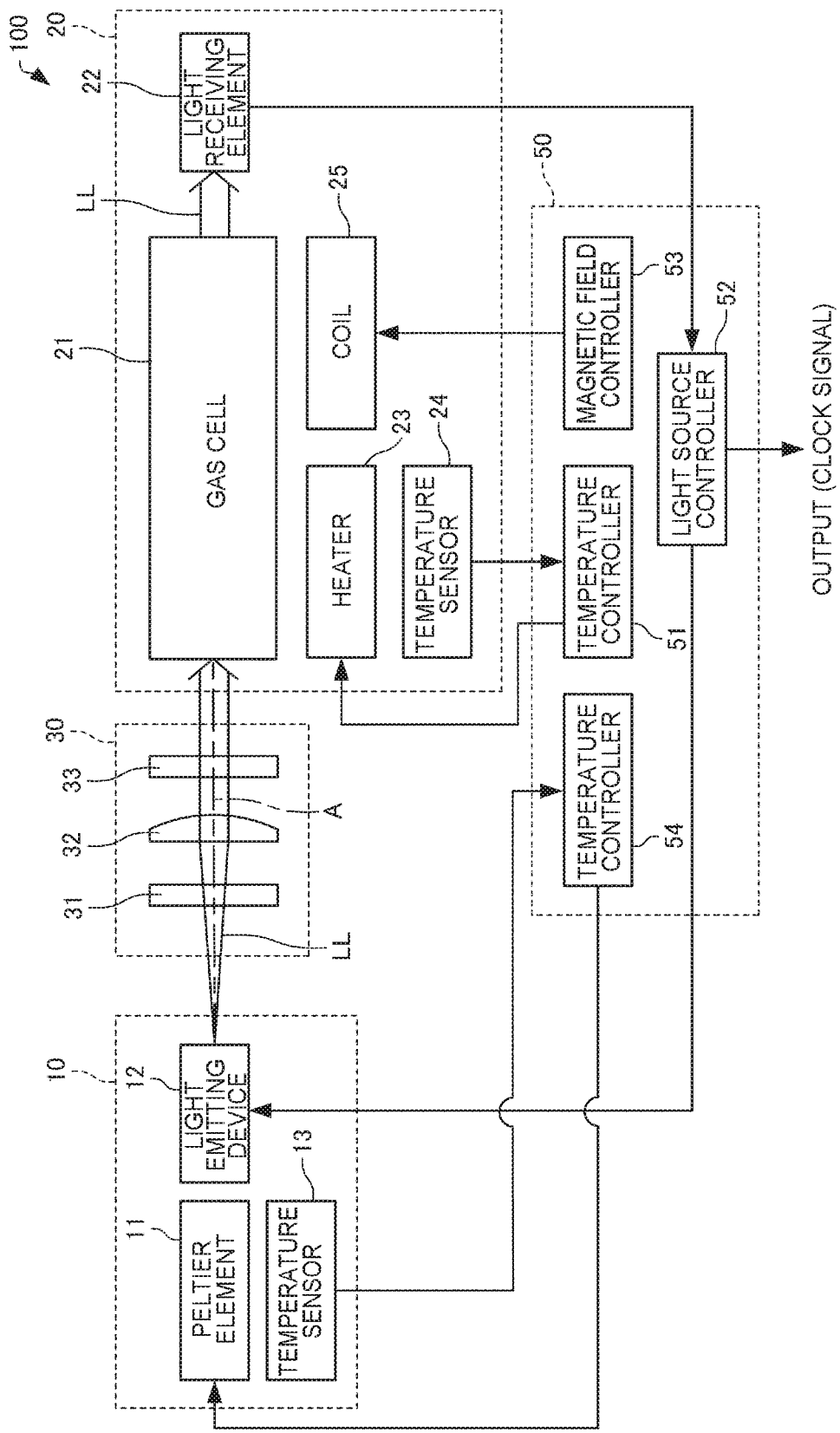
FIG. 1 is a schematic diagram showing a frequency signal generation apparatus according to an embodiment.

First, a frequency signal generation apparatus according to an embodiment will be explained with reference to the drawings. FIG. 1 is a schematic diagram showing a frequency signal generation apparatus 100 according to the embodiment.

The frequency signal generation apparatus 100 is an atomic oscillator using a quantum interference effect (CPT: Coherent Population Trapping) that causes a phenomenon that, when two resonance lights having specific different wavelengths are simultaneously applied to alkali metal atoms, the two resonance lights are not absorbed by the alkali metal atoms, but transmitted through the atoms. The phenomenon by the quantum interference effect is also called an electromagnetically induced transparency (EIT) phenomenon. Alternatively, the frequency signal generation apparatus according to the embodiments may be an atomic oscillator using a double resonance phenomenon by light and microwave.

As shown in FIG. 1, the frequency signal generation apparatus 100 includes a light emitting device module 10, an atom cell unit 20, an optical system unit 30 provided between the light emitting device module 10 and the atom cell unit 20, and a control unit 50 that controls operation of the light emitting device module 10 and the atom cell unit 20. As below, first, a schematic configuration of the frequency signal generation apparatus 100 will be explained.

The light emitting device module 10 has a Peltier element 11, a light emitting device 12, and a temperature sensor 13. The light emitting device 12 outputs linearly-polarized light LL containing two kinds of lights having different frequencies. The temperature sensor 13 detects the temperature of the light emitting device 12. The Peltier element 11 adjusts the temperature of the light emitting device 12.

The optical system unit 30 has a dimming filter 31, a lens 32, and a quarter-wave plate 33. The dimming filter 31 reduces the intensity of the light LL output from the light emitting device 12. The lens 32 adjusts the radiation angle of the light LL. The quarter-wave plate 33 converts the two kinds of lights having different frequencies contained in the light LL from linearly-polarized lights into circularly-polarized lights i.e., right circularly-polarized lights or left circularly-polarized lights.

The atom cell unit 20 has an atom cell 21, a light receiving element 22, a heater 23, a temperature sensor 24, and a coil 25.

The atom cell 21 has light transmissivity and houses alkali metal atoms. The alkali metal atom has energy levels of a three-level system of two ground levels different from each other and an excited level. The light LL output from the light emitting device 12 enters the atom cell 21 via the dimming filter 31, the lens 32, and the quarter-wave plate 33. Then, the light receiving element 22 receives and detects the light LL passing through the atom cell 21.

The heater 23 heats the alkali metal atoms housed in the atom cell 21 to gasify at least part of the alkali metal atoms. The temperature sensor 24 detects the temperature of the atom cell 21. The coil 25 applies a magnetic field in a predetermined direction to the alkali metal atoms housed in the atom cell 21 to Zeeman-split the energy levels of the alkali metal atoms. In the Zeeman split state of the alkali metal atoms, when a resonance light pair of circularly-polarized lights are applied to the alkali metal atoms, of the plurality of levels at which the alkali metal atoms are Zeeman-split, the number of alkali metal atoms at the desired energy level may be made larger relative to the numbers of alkali metal atoms at the other energy levels. Accordingly, the number of atoms that expresses the desired EIT phenomenon increases and the intensity of the desired EIT signal becomes higher. As a result, the oscillation characteristics of the frequency signal generation apparatus 100 can be improved.

The control unit 50 has a temperature controller 51, a light source controller 52, a magnetic field controller 53, and a temperature controller 54. The temperature controller 51 controls energization to the heater 23 so that the temperature inside of the atom cell 21 may be a desired temperature based on the detection result of the temperature sensor 24. The magnetic field controller 53 controls energization to the coil 25 so that the magnetic field generated by the coil 25 can be constant. The temperature controller 54 controls energization to the Peltier element 11 so that the temperature of the light emitting device 12 may be a desired temperature based on the detection result of the temperature sensor 13.

The light source controller 52 controls the frequencies of the two kinds of lights contained in the light LL output from the light emitting device 12 so that the EIT phenomenon may occur based on the detection result of the light receiving element 22. Here, when the two kinds of lights become the resonance light pair having a frequency difference corresponding to the energy difference between the two ground levels of the alkali metal atoms housed in the atom cell 21, the EIT phenomenon occurs. The light source controller 52 includes a voltage controlled oscillator (VCO, not shown) in which the oscillation frequency is controlled to be stabilized in synchronization with the control of the frequencies of the two kinds of lights, and outputs the output signal of the voltage controlled oscillator as an output signal (clock signal) of the frequency signal generation apparatus 100.

As above, the schematic configuration of the frequency signal generation apparatus 100 is explained. As below, the more specific configuration of the frequency signal generation apparatus 100 will be explained with reference to FIGS. 2 and 3.

Figure 2:
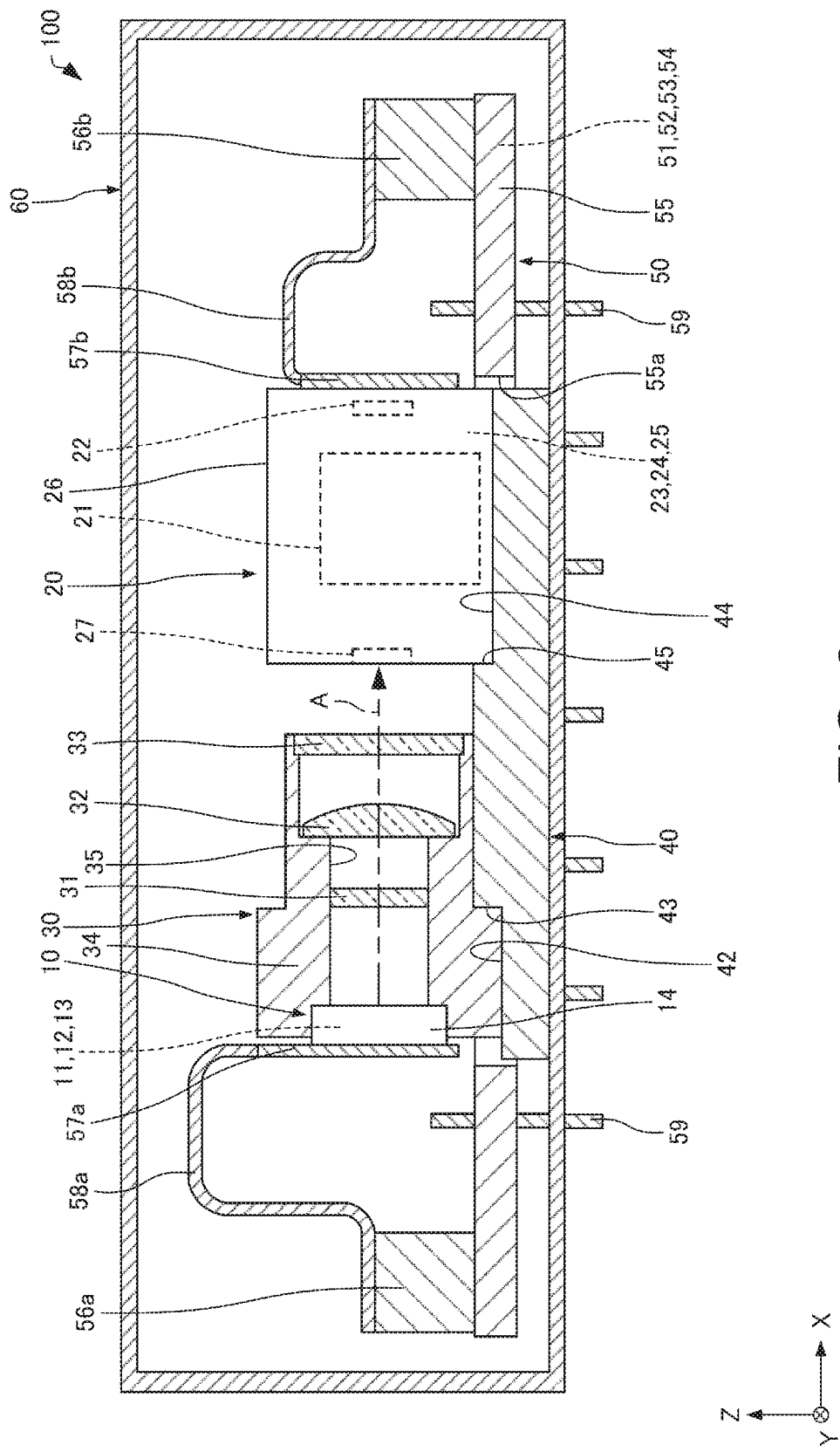
FIG. 2 is a sectional view schematically showing the frequency signal generation apparatus according to the embodiment.
Figure 3:
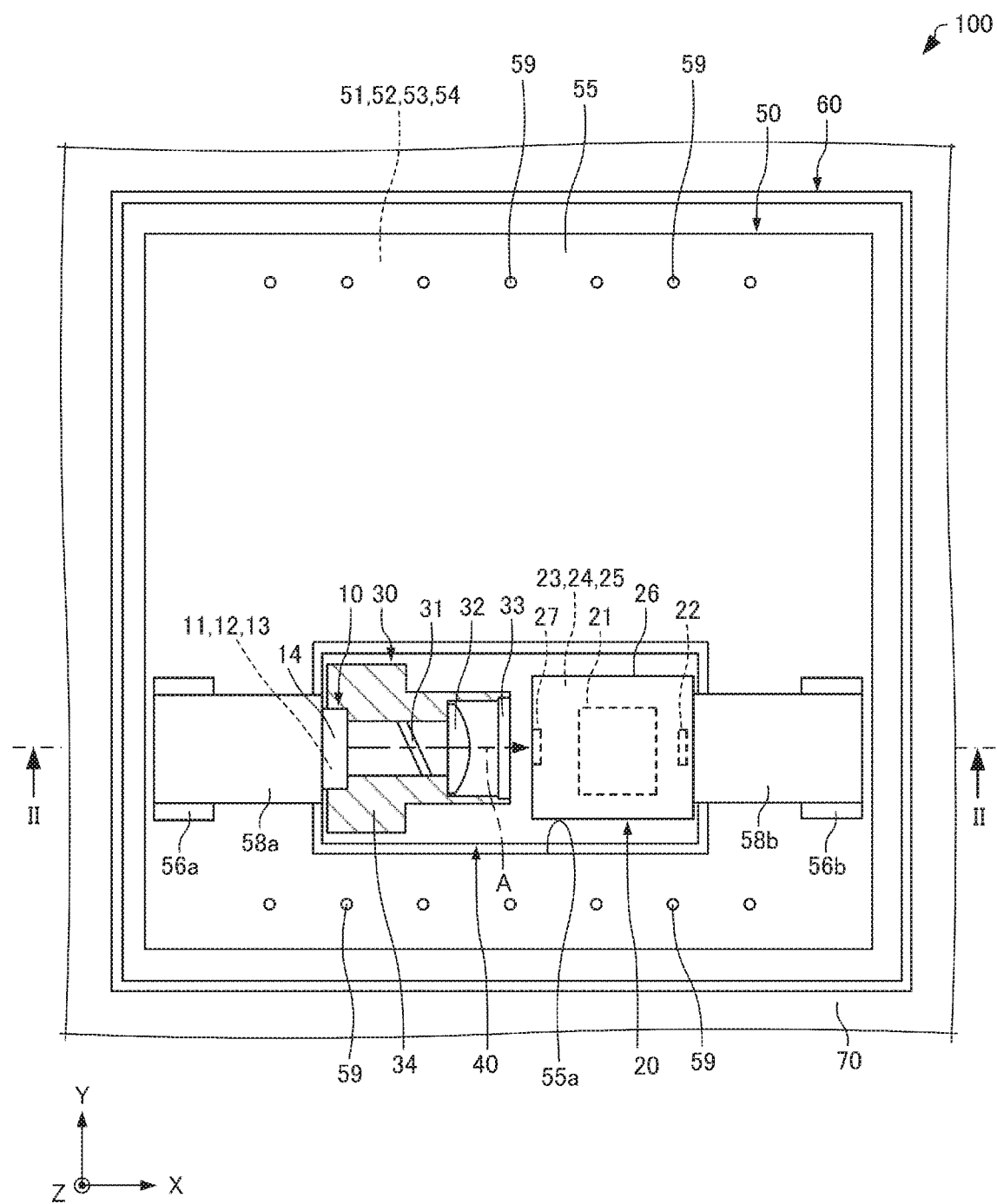
FIG. 3 is a plan view schematically showing the frequency signal generation apparatus according to the embodiment.

FIG. 2 is a sectional view schematically showing the frequency signal generation apparatus 100. FIG. 3 is a plan view schematically showing the frequency signal generation apparatus 100. Note that FIG. 2 is the sectional view along line II-II in FIG. 3. Further, in FIGS. 2 and 3, as three axes orthogonal to one another, an X-axis, Y-axis, and Z-axis are shown. For convenience, in FIG. 3, a part of a container 60 is omitted. Further, in FIG. 3, a holder 34 of the optical system unit 30 is shown in a sectional view cut along the XY-plane.

The frequency signal generation apparatus 100 includes the light emitting device module 10, the atom cell unit 20, the optical system unit 30, a supporting member 40 that supports the optical system unit 30, the control unit 50 electrically connected to the light emitting device module 10 and the atom cell unit 20, and the container 60 housing the parts.

Here, the Z-axis is an axis perpendicular to a placement surface 42 of the supporting member 40 and the positive direction thereof is a direction from the supporting member 40 toward the provided component. The X-axis is an axis along the light LL from the light emitting device module 10 and the positive direction thereof is a direction in which light travels. In other words, the X-axis is an axis along the arrangement direction of the light emitting device module 10 and the atom cell unit 20, and the positive direction thereof is a direction from the light emitting device module 10 toward the atom cell unit 20. The Y-axis is an axis perpendicular to the X-axis and the Z-axis.

The light emitting device module 10 has the Peltier element 11, the light emitting device 12, the temperature sensor 13, and a package 14 housing the parts. The light emitting device 12 is e.g. a vertical cavity surface emitting laser (VCSEL). The light emitting device 12 is a light source that outputs the light LL. Hereinafter, the light emitting device 12 is also referred to as "light source 12".

The optical system unit 30 holds the light emitting device module 10. The optical system unit 30 has the dimming filter 31, the lens 32, the quarter-wave plate 33, and the holder 34 holding the parts.

A through hole 35 is provided in the holder 34. The through hole 35 is a passage region of the light LL and the dimming filter 31, the lens 32, and the quarter-wave plate 33 are sequentially placed in the through hole 35. As shown in FIG. 3, the dimming filter 31 is fixed to the holder 34 by an adhesive agent (not shown) in a position tilted relative to a plane having a normal along an optical axis A of the light LL. The lens 32 and the quarter-wave plate 33 are respectively fixed to the holder 34 by adhesive agents (not shown) in positions along the plane having the normal along the optical axis A. The light emitting device module 10 is attached to an end portion of the through hole 35 on the dimming filter 31 side (on the left side in the −X-axis direction) by an attachment member (not shown). The holder 34 is formed using e.g. a metal material such as aluminum and has heat dissipation. Thereby, the light emitting device module 10 can efficiently dissipate heat.

Note that, in the optical system unit 30, depending on the intensity, radiation angle, etc. of the light LL from the light source 12, at least one of the dimming filter 31 and the lens 32 may be omitted. Further, the optical system unit 30 may have another optical element than the dimming filter 31, the lens 32, or the quarter-wave plate 33. The order of the arrangement of the dimming filter 31, the lens 32, and the quarter-wave plate 33 is not limited to the order in the drawings, but arbitrary.

The atom cell unit 20 has the atom cell 21, the light receiving element 22, the heater 23, the temperature sensor 24, the coil 25, and a package 26 housing the parts.

The gaseous alkali metal atoms of rubidium, cesium, sodium, or the like are housed in the atom cell 21. The detailed explanation of the atom cell 21 will be described later.

The light receiving element 22 is placed on the opposite side to the light emitting device module 10 with respect to the atom cell 21. The light receiving element 22 is not particularly limited as long as the element can detect the intensity of the light LL (resonance light pair) transmitted through the atom cell 21, but includes e.g. a photodetector such as a solar cell or photodiode.

The heater 23 is placed on the side in the +Z-axis direction of the atom cell 21 or connected to the atom cell 21 via a heat conducting member of a metal or the like (not shown). The heater 23 is not particularly limited as long as the heater can heat the atom cell 21, but may be e.g. various heaters having heat generation resistors, Peltier element, or the like.

The temperature sensor 24 is placed near the atom cell 21 or heater 23 (not shown). The temperature sensor 24 is not particularly limited as long as the sensor can detect the temperature of the atom cell 21 or heater 23, but may be various known temperature sensors including a thermistor and thermocouple.

The coil 25 is e.g. a solenoid coil wounded along the outer circumference of the atom cell 21 or a pair of Helmholtz coils opposed via the atom cell 21 (not shown). The coil 25 generates a magnetic field in a direction along (parallel to) the optical axis A of the light LL inside of the atom cell 21. Thereby, the gaps between the degenerated different energy levels of the alkali metal atoms housed in the atom cell 21 are expanded by Zeeman splitting, and resolution can be improved and the line width of the EIT signal can be made smaller. Note that the magnetic field generated by the coil 25 may be a direct-current magnetic field or alternating-current magnetic field, or a magnetic field formed by superimposition of a direct-current magnetic field and an alternating-current magnetic field.

The package 26 houses the atom cell 21, the light receiving element 22, the heater 23, the temperature sensor 24, and the coil 25. The package 26 directly or indirectly supports the atom cell 21, the light receiving element 22, the heater 23, the temperature sensor 24, and the coil 25. A plurality of terminals electrically connected to the light receiving element 22, the heater 23, the temperature sensor 24, and the coil 25 are provided on the outer surface of the package 26. A window 27 having transmissivity to the light LL is provided in the package 26.

The material of the package 26 is not particularly limited, but may be e.g. ceramics, metal, or the like. For example, permalloy, kovar, or the like may be used for the material of the package 26 so that the package 26 may function as a magnetic shield. The material of the window 27 is e.g. a glass material or the like. The interior of the package 26 is preferably at lower pressure than the atmospheric pressure. Thereby, the temperature of the atom cell 21 can be controlled easily and highly accurately. As a result, the characteristics of the frequency signal generation apparatus 100 can be improved.

The supporting member 40 has a plate-like shape, and the atom cell unit 20 and the optical system unit 30 are mounted on the supporting member 40. The supporting member 40 has the placement surface 42 along the shape of the lower surface of the holder 34 of the optical system unit 30. A step 43 is formed on the placement surface 42. The step 43 engages with the step of the lower surface of the holder 34 to restrict movement of the holder 34 toward the atom cell unit 20 side (the side in the +X-direction). Similarly, the supporting member 40 has a placement surface 44 along the shape of the lower surface of the package 26 of the atom cell unit 20. A step 45 is formed on the placement surface 44. The step 45 engages with the end surface of the package 26 to restrict movement of the package 26 toward the optical system unit 30 side (the side in the −X-direction).

As described above, the relative position relationship between the atom cell unit 20 and the optical system unit 30 can be defined by the supporting member 40. The light emitting device module 10 is fixed to the holder 34, and thus, the relative position relationship of the light emitting device module 10 with the atom cell unit 20 and optical system unit 30 is defined. Here, the package 26 and the holder 34 are respectively fixed to the supporting member 40 by fixing members such as screws (not shown). Further, the supporting member 40 is fixed to the container 60 by fixing members such as screws (not shown). The supporting member 40 is formed using e.g. a metal material such as aluminum and has heat dissipation. Thereby, the light emitting device module 10 can efficiently dissipate heat.

As shown in FIG. 3, the control unit 50 has a circuit board 55, two connectors 56a, 56b provided on the circuit board 55, a rigid wiring board 57a connected to the light emitting device module 10, a rigid wiring board 57b connected to the atom cell unit 20, a flexible wiring board 58a that connects the connector 56a and the rigid wiring board 57a, a flexible wiring board 58b that connects the connector 56b and the rigid wiring board 57b, and a plurality of lead pins 59 penetrating the circuit board 55.

On the circuit board 55, an IC (Integrated Circuit) chip (not shown) is provided. The IC chip functions as the temperature controllers 51 and 54, the light source controller 52, and the magnetic field controller 53. A through hole 55a through which the supporting member 40 is inserted is provided in the circuit board 55. The circuit board 55 is supported with respect to the container 60 via the plurality of lead pins 59. The plurality of lead pins 59 respectively penetrate inside and outside of the container 60 and are electrically connected to the circuit board 55.

Note that the configuration electrically connecting the circuit board 55 and the light emitting device module 10 and the configuration electrically connecting the circuit board 55 and the atom cell unit 20 are not limited to the connectors 56a, 56b, the rigid wiring boards 57a, 57b, and the flexible wiring boards 58a, 58b shown in the drawings, but may respectively be other known connectors and wires.

The container 60 houses the light emitting device module 10, the atom cell unit 20, the optical system unit 30, the supporting member 40, and the control unit 50. The container 60 is formed using e.g. a metal material such as permalloy or kovar and has a magnetic shielding property. Thereby, an adverse effect by an external magnetic field on the characteristics of the frequency signal generation apparatus 100 can be suppressed.

1.2. Atom Cell

Figure 4:
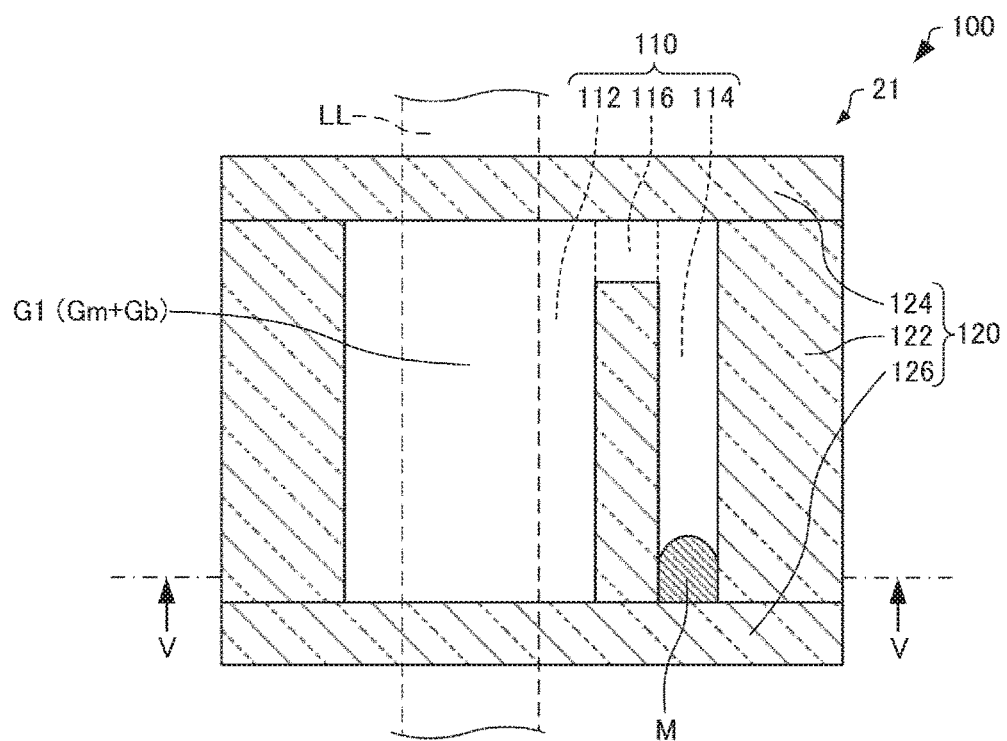
FIG. 4 is a sectional view schematically showing an atom cell of the frequency signal generation apparatus according to the embodiment.
Figure 5:
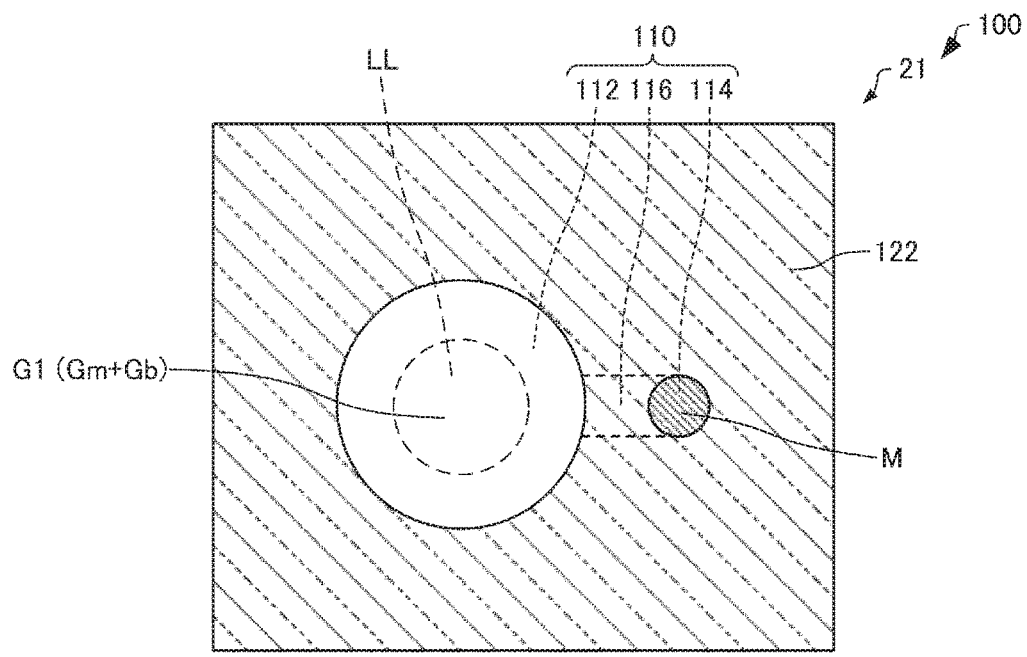
FIG. 5 is a sectional view schematically showing the atom cell of the frequency signal generation apparatus according to the embodiment.

Next, the atom cell 21 will be explained in detail. FIG. 4 is a sectional view schematically showing the atom cell 21. FIG. 5 is a sectional view schematically showing the atom cell 21 along line V-V in FIG. 4.

The light LL output from the light source 12 passes through the atom cell 21. As shown in FIGS. 4 and 5, the atom cell 21 includes an internal space 110 and a wall 120. The internal space 110 includes a cavity 112, a reservoir 114, and a communication hole 116.

The cavity 112 is e.g. at the saturated vapor pressure of the alkali metal atom. In the example shown in the drawings, the shape of the cavity 112 is a cylindrical shape. The light LL passes through the cavity 112.

The reservoir 114 communicates with the cavity 112 via the communication hole 116. The volume of the reservoir 114 is smaller than the volume of the cavity 112. In the example shown in the drawings, the shape of the reservoir 114 is a cylindrical shape.

A first gas G1 containing gaseous alkali metal atoms Gm and a buffer gas Gb is enclosed in the atom cell 21. The first gas G1 exists in the internal space 110. Specifically, the first gas G1 exists in the cavity 112, the reservoir 114, and the communication hole 116.

The gaseous alkali metal atoms Gm are e.g. rubidium, cesium, or the like as described above. The gaseous alkali metal atoms Gm are in the gas state. The reservoir 114 is temperature-controlled at a lower temperature than that of the cavity 112. Accordingly, liquid alkali metal atoms M exist in the reservoir 114. Thereby, when the gaseous alkali metal atoms Gm in the cavity 112 decrease by reaction with the wall 120 or the like, the liquid alkali metal atoms M are gasified so that the concentration of the gaseous alkali metal atoms Gm in the cavity 112 can be kept constant. The gaseous alkali metal atoms Gm are alkali metal atoms of the same kind as the liquid alkali metal atoms M.

The buffer gas Gb is e.g. hydrogen gas, helium gas, neon gas, nitrogen gas, argon gas, krypton gas, a mixed gas of these gases, or the like. For example, the buffer gas Gb can suppress lowering of frequency stability of the frequency signal generation apparatus 100 due to collisions between the gaseous alkali metal atoms Gm.

The wall 120 defines the internal space 110. The wall 120 has e.g. a rectangular parallelepiped outer shape. The wall 120 has a main body 122 and windows 124, 126. Two through holes are provided in the main body 122. The two through holes respectively form the cavity 112 and the reservoir 114. The windows 124, 126 are provided with the main body 122 in between. The shapes of the windows 124, 126 are plate-like shapes. The communication hole 116 is provided in a part of the main body 122 located between the cavity 112 and the reservoir 114.

The material of the main body 122 is e.g. silicon, aluminosilicate glass, borosilicate glass, quartz glass, or the like. For example, the main body 122 is formed by processing of a silicon substrate or glass substrate by etching or the like. The windows 124, 126 transmit the light LL. The material of the windows 124, 126 is e.g. aluminosilicate glass, borosilicate glass, quartz glass, or the like. The bonding of the main body 122 and the windows 124, 126 includes bonding using an adhesive, direct bonding, and anodic bonding.

Figure 6:
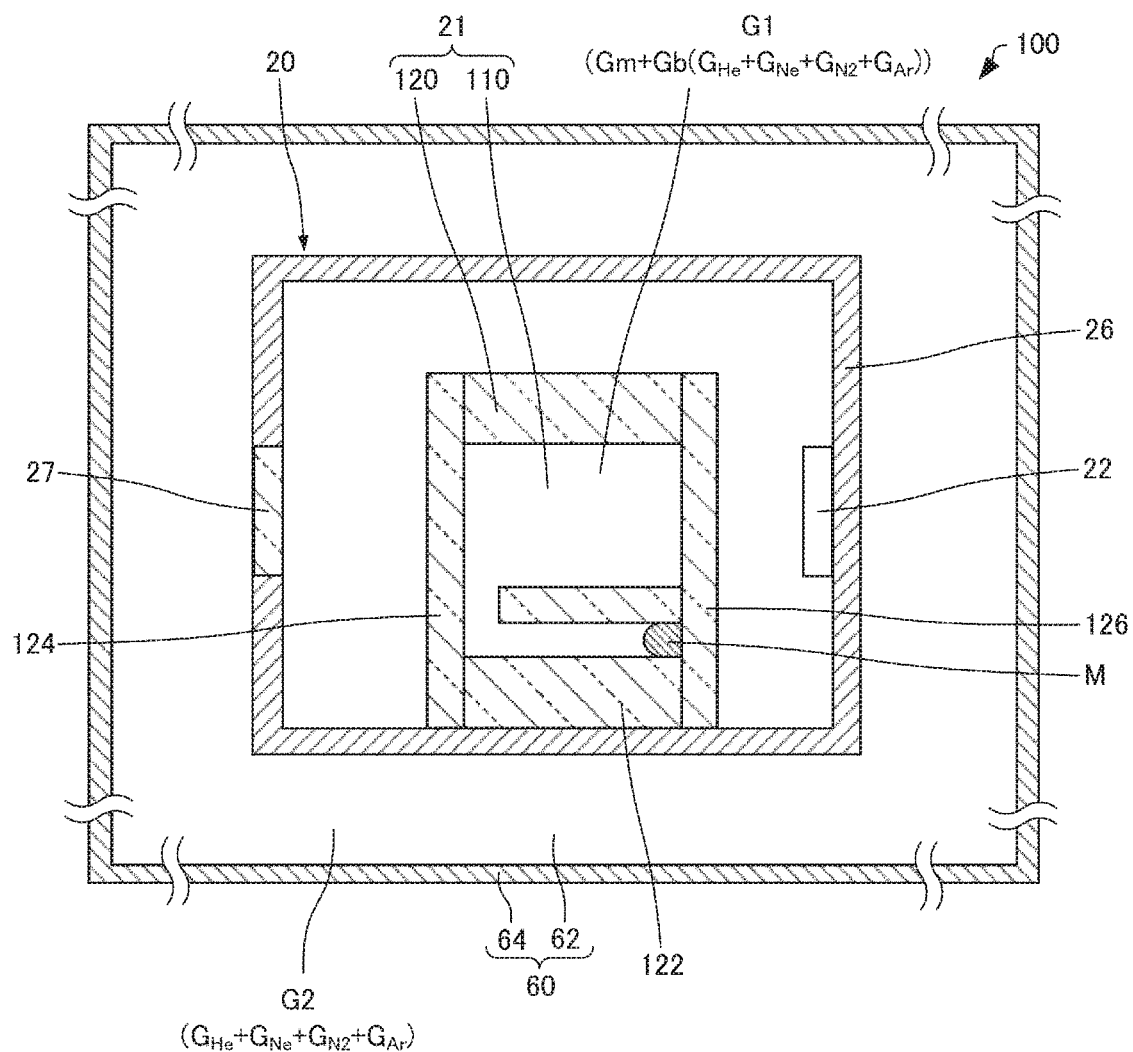
FIG. 6 is a sectional view schematically showing an atom cell unit and a container of the frequency signal generation apparatus according to the embodiment.

Here, FIG. 6 is a sectional view schematically showing the frequency signal generation apparatus 100 and shows only the atom cell unit 20 and the container of the frequency signal generation apparatus 100. For convenience, in FIG. 6, the heater 23, the temperature sensor 24, and the coil 25 of the atom cell unit 20 are not shown.

As shown in FIG. 6, the container 60 houses the atom cell unit 20. That is, the container 60 houses the atom cell 21 and the light receiving element 22 that receives the light LL transmitted through the atom cell 21. The container 60 is also called a package. Further, as shown in FIG. 3, the container 60 houses the light source 12. The material of the container 60 is e.g. permalloy, kovar, or the like as described above. As shown in FIG. 6, the container 60 includes an internal space 62 and a wall 64 that defines the internal space 62.

A second gas G2 is enclosed in the container 60. The second gas G2 exists in the internal space 62. For example, the second gas G2 passes through the window 27 and also exists in the package 26. The internal space 62 is air-tightly sealed.

The second gas G2 contains gas molecules in common with the buffer gas Gb. The pressure of the common gas molecules is substantially the same within the atom cell 21 and within the container 60. In other words, the pressure of the common gas molecules is substantially the same in the internal space 110 of the atom cell 21 and in the internal space 62 of the container 60.

Here, "the pressure of the common gas molecules is substantially the same within the atom cell 21 and within the container 60" includes the case where the pressure (first pressure) of the common gas molecules within the atom cell 21 and the pressure (second pressure) of the common gas molecules within the container 60 are the same and the case where the difference between the first pressure and the second pressure is equal to or lower than 50% of the higher pressure of the first pressure and the second pressure. Note that it is more preferable that the difference between the first pressure and the second pressure is equal to or lower than 20% of the higher pressure of the first pressure and the second pressure.

For example, in the case where the first pressure is 100 torr and the second pressure is 120 torr, the difference between the first pressure and the second pressure is 20 torr, which is equal to or lower than 24 torr as 20% of 120 torr. Accordingly, this case corresponds to "the pressure of the common gas molecules is substantially the same within the atom cell 21 and within the container 60". In the specification, 1 torr is 133.32 Pa.

Note that "the pressure of the common gas molecules within the container 60" refers to the pressure of the common gas molecules within the container 60 and outside of the atom cell 21. For example, the pressure of the common gas molecules between the wall 64 of the container 60 and the package 26 and the pressure of the common gas molecules between the package 26 and the wall 120 of the atom cell 21 are the same.

The pressure of the common gas molecules within the atom cell 21 and the pressure of the common gas molecules within the container 60 can be obtained, for example, by breaking the wall 120 of the atom cell 21 or the wall 64 of the container 60 and executing mass spectrometry using a quadrupole mass spectrometer M-401QA-MU/G (manufactured by CANON ANELVA CORPORATION) or high-resolution multi-turn time of flight mass spectrometer infiTOF-UHV (manufactured by KANOMAX JAPAN INC.) at a known temperature in a known atmosphere.

The common gas molecules contained in the buffer gas Gb and the second gas G2 are of hydrogen, helium, neon, nitrogen, argon, or krypton. The gas molecules are in a gas state. The common gas molecules may be monoatomic molecules. The buffer gas Gb and the second gas G2 may contain a plurality of kinds of common gas molecules or only one kind of common gas molecules. The buffer gas Gb and the second gas G2 may be formed by only a plurality of kinds of common gas molecules or may contain other gas molecules than the common gas molecules.

In the example shown in FIG. 6, the buffer gas Gb and the second gas G2 contain helium gas $G_{He}$, neon gas $G_{Ne}$, nitrogen gas $G_{N2}$, and argon gas $G_{Ar}$. The respective pressure of the helium gas $G_{He}$, neon gas $G_{Ne}$, nitrogen gas $G_{N2}$, and argon gas $G_{Ar}$ is substantially the same within the atom cell 21 and within the container 60. In the example shown in the drawing, the buffer gas Gb and the second gas G2 contain a plurality of kinds of common gas molecules and are formed by only the plurality of kinds of common gas molecules.

The total pressure of the first gas G1 is lower than the atmospheric pressure. The atmospheric pressure is e.g. pressure outside of the container 60. The atmospheric pressure is e.g. 760 torr. The total pressure of the first gas G1 is e.g. from 50 torr to 200 torr.

The total pressure of the first gas G1 is the sum of the partial pressure of the gaseous alkali metal atoms Gm and the partial pressure of the buffer gas Gb. Note that the partial pressure of the gaseous alkali metal atoms Gm is significantly smaller than the partial pressure of the buffer gas Gb. Therefore, the total pressure of the first gas G1 can be the pressure of the buffer gas Gb within the atom cell 21.

The total pressure of the second gas G2 is substantially the same as the atmospheric pressure. Here, "the total pressure of the second gas G2 is substantially the same as the atmospheric pressure" includes the case where the total pressure of the second gas G2 is the same as the atmospheric pressure and the case where the difference between the total pressure of the second gas G2 and the atmospheric pressure is equal to or lower than 20% of the higher pressure of the total pressure of the second gas G2 and the atmospheric pressure. Note that it is more preferable that the total pressure of the second gas G2 is the same as the atmospheric pressure and the difference between the total pressure of the second gas G2 and the atmospheric pressure is equal to or lower than 10% of the higher pressure of the total pressure of the second gas G2 and the atmospheric pressure.

In the frequency signal generation apparatus 100, for example, the atom cell 21 is fabricated in a predetermined atmosphere and the container 60 is fabricated to house the atom cell 21 in the atmosphere in which the atom cell 21 is fabricated, and thereby, the pressure of the common gas molecules contained in the buffer gas Gb and the second gas G2 can be made substantially the same within the atom cell 21 and within the container 60.

The frequency signal generation apparatus 100 has the following features, for example.

In the frequency signal generation apparatus 100, the pressure of the common gas molecules contained in the buffer gas Gb and the second gas G2 is substantially the same within the atom cell 21 and within the container 60. Accordingly, the common gas molecules contained in the buffer gas Gb permeating the wall 120 of the atom cell 21 and flowing out from the atom cell 21 and the common gas molecules contained in the second gas G2 permeating the wall 120 of the atom cell 21 and flowing into the atom cell 21 can be suppressed. Thereby, in the frequency signal generation apparatus 100, fluctuations of partial pressure of the gas molecules contained in the buffer gas Gb can be suppressed. As a result, the frequency signal generation apparatus 100 has higher frequency stability.

For example, if the pressure of the common gas molecules contained in the buffer gas Gb and the second gas G2 is different between within the atom cell 21 and within the container 60, the gas molecules permeate the wall 120 of the atom cell 21 so that the pressure difference can be smaller, and the partial pressure of the gas molecules contained in the buffer gas Gb fluctuates. Particularly, hydrogen and helium have lower molecular weights and easily permeate the wall 120.

When the difference between the first pressure of the common gas molecules within the atom cell 21 and the second pressure of the common gas molecules within the container 60 is equal to or lower than 20% of the higher pressure of the first pressure and the second pressure, the fluctuations of the partial pressure of the gas molecules contained in the buffer gas Gb can be suppressed to the degree without an influence on the frequency stability of the frequency signal generation apparatus 100.

In the frequency signal generation apparatus 100, the total pressure of the second gas G2 is substantially the atmospheric pressure. Accordingly, in the frequency signal generation apparatus 100, lowering of frequency stability by a change of the shape of the wall 64 of the container 60 due to the difference between the total pressure of the second gas G2 and the atmospheric pressure can be suppressed. When the difference between the total pressure of the second gas G2 and the atmospheric pressure is equal to or lower than 20% of the higher pressure of the total pressure of the second gas G2 and the atmospheric pressure, the change of shape of the wall 64 can be suppressed to the degree without an influence on the frequency stability of the frequency signal generation apparatus 100.

In the frequency signal generation apparatus 100, the pressure of the buffer gas Gb within the atom cell 21 is lower than the atmospheric pressure. Accordingly, in the frequency signal generation apparatus 100, intensity of the EIT signal is higher. For example, if the pressure of the buffer gas Gb within the atom cell 21 is equal or higher than the atmospheric pressure, the gaseous alkali metal atoms can be harder to move within the atom cell 21 and the intensity of the EIT signal can be lower.

In the frequency signal generation apparatus 100, the second gas G2 contains the plurality of kinds of the common gas molecules contained in the buffer gas Gb and the second gas G2. In the frequency signal generation apparatus 100, the fluctuations of the partial pressure of the plurality of kinds of the common gas molecules contained in the buffer gas Gb can be suppressed.

In the frequency signal generation apparatus 100, the container 60 houses the light source 12 and the light receiving element 22. Accordingly, it is not necessary to provide a window for transmission of the light LL output from the light source 12 in the container 60, and thereby, the second gas G2 permeating the window and flowing out of the container 60 can be suppressed.

In the frequency signal generation apparatus 100, the common gas molecules contained in the buffer gas Gb and the second gas G2 are of hydrogen, helium, neon, nitrogen, argon, or krypton. Accordingly, in the frequency signal generation apparatus 100, in the buffer gas Gb, lowering of the frequency stability due to collisions between the gaseous alkali metal atoms Gm can be suppressed.

In the frequency signal generation apparatus 100, the material of the windows 124, 126 is aluminosilicate glass. Accordingly, in the frequency signal generation apparatus 100, permeation of the gas molecules through the windows 124, 126 can be further suppressed compared to the case where the material of the windows 124, 126 is quartz glass.

Note that the atom cell according to the invention does not necessarily include the reservoir 114 and communication hole 116 (not shown). In other words, the portion between the cavity 112 and the reservoir 114 of the main body 122 is not necessarily provided.

Figure 7:
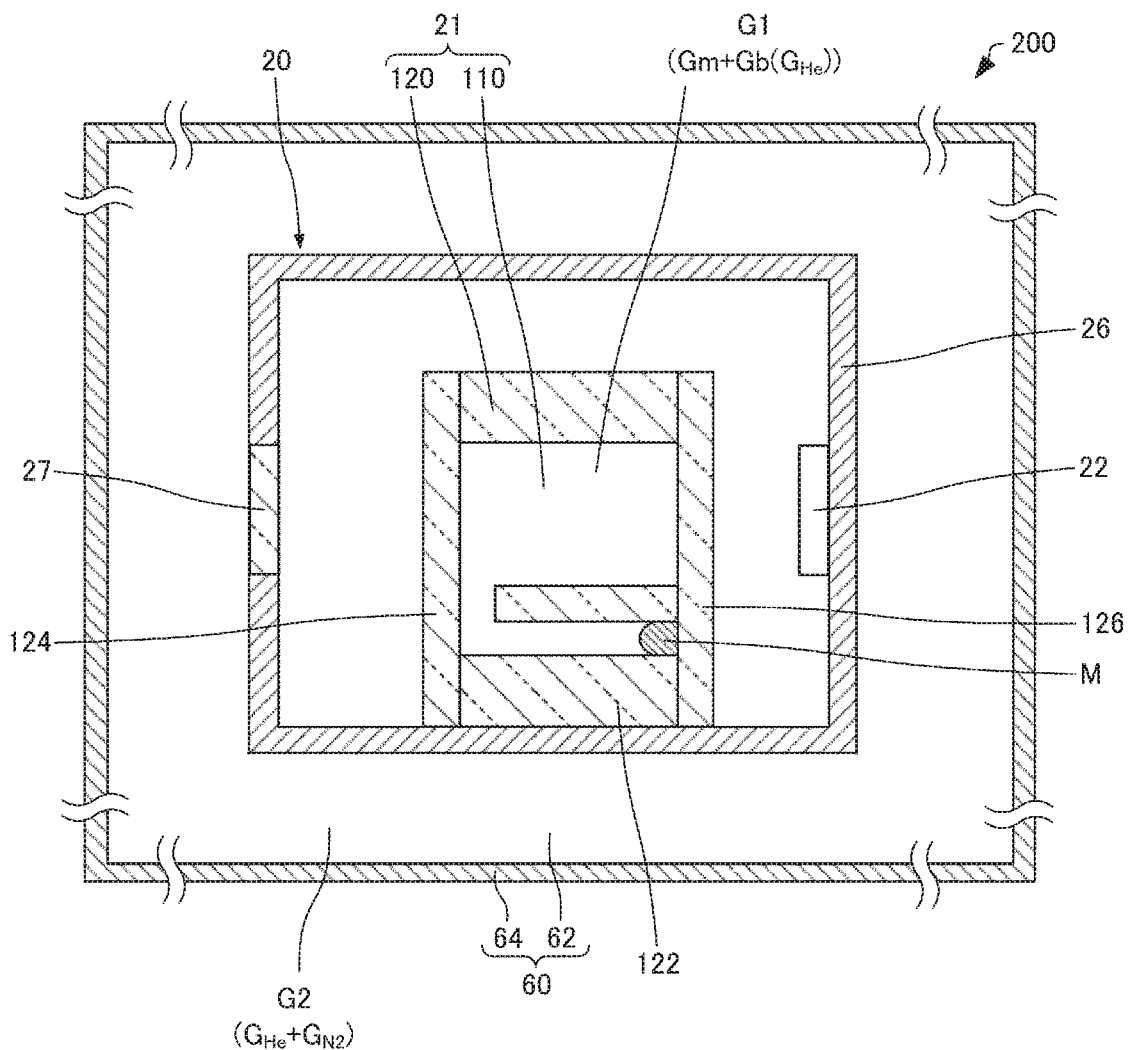
FIG. 7 is a sectional view schematically showing an atom cell unit and a container of a frequency signal generation apparatus according to a first modified example of the embodiment.

2. Modified Examples of Frequency Signal Generation Apparatus 2.1. First Modified Example Next, a frequency signal generation apparatus 200 according to a first modified example of the embodiment will be explained with reference to the drawings. FIG. 7 is a sectional view schematically showing the frequency signal generation apparatus 200 according to the first modified example of the embodiment, and shows only the atom cell unit 20 and the container 60 of the frequency signal generation apparatus 200. Note that, for convenience, in FIG. 7, the heater 23, the temperature sensor 24, and the coil 25 of the atom cell unit 20 are not shown.

As below, in the frequency signal generation apparatus 200 according to the first modified example of the embodiment, differences from the example of the above described frequency signal generation apparatus 100 will be explained, and the explanation of the same configurations will be omitted. The same applies to a frequency signal generation apparatus according to a second modified example of the embodiment, which will be described later.

In the above described frequency signal generation apparatus 100, as shown in FIG. 6, the buffer gas Gb and the second gas G2 contain the plurality of kinds of common gas molecules and are formed by only the plurality of kinds of common gas molecules.

On the other hand, in the frequency signal generation apparatus 200, as shown in FIG. 7, the buffer gas Gb and the second gas G2 are not formed by only a plurality of kinds of common gas molecules. In the frequency signal generation apparatus 200, the second gas G2 contains gas molecules having lower permeability for the wall 120 of the atom cell 21 than the common gas molecules contained in the buffer gas Gb and the second gas G2.

In the example shown in the drawing, the buffer gas Gb is formed by only helium gas $G_{He}$ and the second gas G2 is formed by only helium gas $G_{He}$ and nitrogen gas $G_{N2}$. The nitrogen gas $G_{N2}$ has lower permeability for the wall 120 of the atom cell 21 than the helium gas $G_{He}$.

Note that the permeability of the gas for the wall 120 of the atom cell 21 may be also referred to as "permeability coefficient" of the gas for the material of the wall 120. The permeability coefficient of the gas is a unique value depending on the kind of gas molecules and the material of the object that the gas permeates.

The buffer gas Gb may contain gas molecules having lower permeability for the wall 120 of the atom cell 21 than the common gas molecules contained in the buffer gas Gb and the second gas G2. Both the buffer gas Gb and the second gas G2 contain the gas molecules having lower permeability, and thereby, permeation of the gas molecules having lower permeability through the wall 120 of the atom cell 21 can be suppressed more reliably compared to the case where one of the buffer gas Gb and the second gas G2 contains the gas molecules having lower permeability and the other does not contain the gas molecules having lower permeability. Alternatively, for example, the partial pressure of the gas molecules having lower permeability in the buffer gas Gb and the partial pressure of the gas molecules having lower permeability in the second gas G2 are set to be the same, and thereby, the permeation of the gas molecules having lower permeability through the wall 120 of the atom cell 21 can be suppressed more reliably.

Alternatively, the buffer gas Gb and the second gas G2 may contain a plurality of kinds of common gas molecules.

2.2. Second Modified Example

Figure 8:
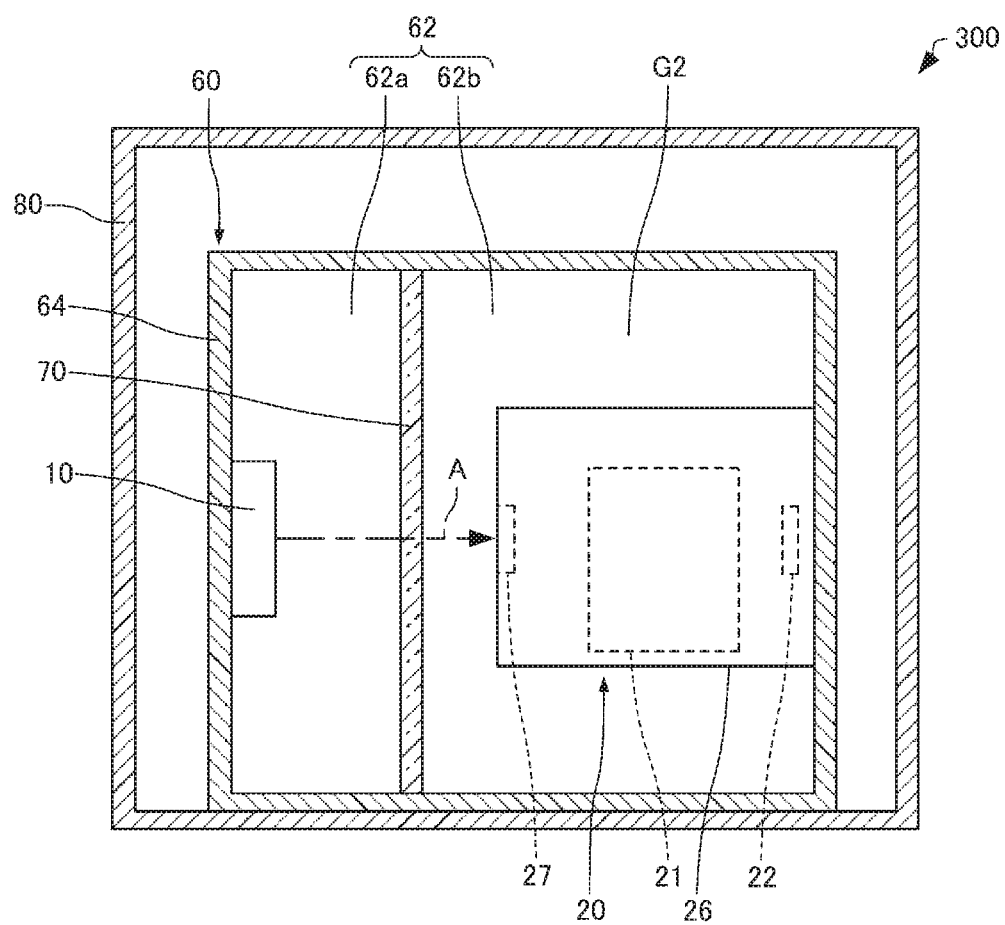
FIG. 8 is a sectional view schematically showing a light emitting device module, an atom cell unit, a container, and a partition plate of a frequency signal generation apparatus according to a second modified example of the embodiment.

Next, a frequency signal generation apparatus 300 according to the second modified example of the embodiment will be explained with reference to the drawings. FIG. 8 is a sectional view schematically showing the frequency signal generation apparatus 300 according to the second modified example of the embodiment, and shows only the light emitting device module 10, the atom cell unit 20, the container 60, a partition plate 70, and a container 80 of the frequency signal generation apparatus 300. Note that, for convenience, in FIG. 8, the heater 23, the temperature sensor 24, and the coil 25 of the atom cell unit 20 are not shown.

As shown in FIG. 8, the frequency signal generation apparatus 300 is different from the above described frequency signal generation apparatus 100 in that the partition plate 70 is provided in the internal space 62 of the container 60.

In the frequency signal generation apparatus 300, the internal space 62 includes a first space 62a and a second space 62b. The first space 62a and the second space 62b are partitioned by the partition plate 70. The light emitting device module 10 is placed in the first space 62a. The atom cell unit 20 is placed in the second space 62b. The partition plate 70 transmits the light output from the light emitting device module 10. The material of the partition plate 70 is e.g. glass.

The second gas G2 exists in the first space 62a and the second space 62b. The second gas G2 may permeate the partition plate 70.

The container 80 houses the container 60. The container 80 is also called a package. The material of the container 80 is e.g. permalloy, kovar, or the like. The second gas G2 can be enclosed in the container 80.

3. Frequency Signal Generation System

Figure 9:
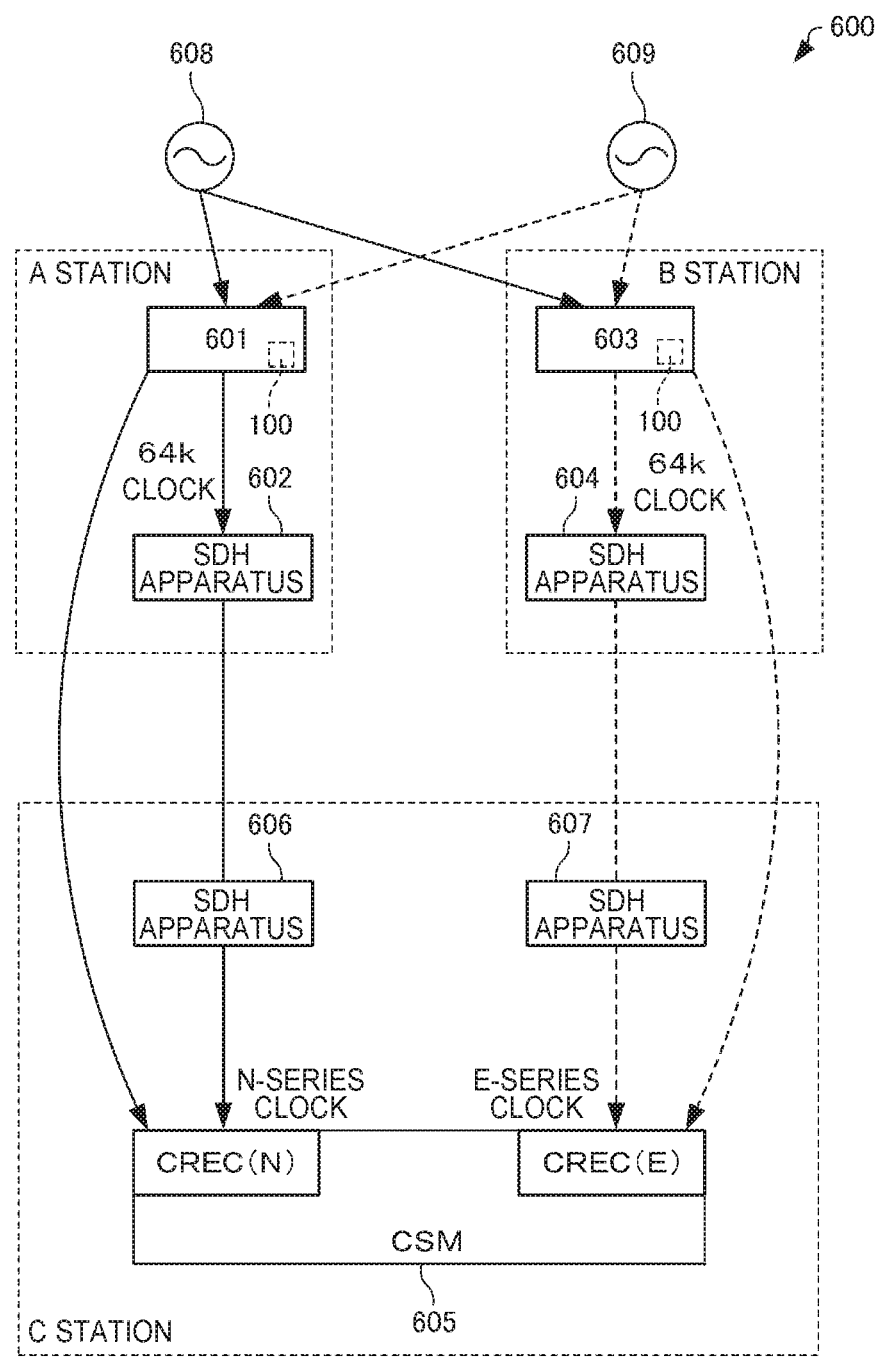
FIG. 9 is a schematic configuration diagram showing a frequency signal generation system according to the embodiment.

Next, a frequency signal generation system 600 according to the embodiment will be explained with reference to the drawings. The frequency signal generation system 600 may be called a clock transmission system (timing server) 600. FIG. 9 is a schematic configuration diagram showing the clock transmission system 600.

A clock transmission system according to the embodiment includes a frequency signal generation apparatus according to the embodiments described above. As below, as an example, the clock transmission system 600 including the frequency signal generation apparatus 100 will be explained.

The clock transmission system 600 is a system having N (Normal)-series and E (Emergency)-series redundant configurations for synchronizing clocks of respective apparatuses within a time-division multiplexing network.

As shown in FIG. 9, the clock transmission system 600 includes an A station (upstream (N-series)) clock supply apparatus 601 and an SDH (Synchronous Digital Hierarchy) apparatus 602, a B station (upstream (E-series)) clock supply apparatus 603 and an SDH apparatus 604, and a C station (downstream) clock supply apparatus 605 and SDH apparatuses 606, 607. The clock supply apparatus 601 has the frequency signal generation apparatus 100 and generates N-series clock signals. The frequency signal generation apparatus 100 within the clock supply apparatus 601 generates clock signals in synchronization with higher-accuracy clock signals from master clocks 608, 609 including atomic oscillators using cesium.

The SDH apparatus 602 transmits and receives main signals based on the clock signals from the clock supply apparatus 601, and superimposes the N-series clock signals on the main signals and transmits the signals to the downstream clock supply apparatus 605. The clock supply apparatus 603 has the frequency signal generation apparatus 100 and generates the E-series clock signals. The frequency signal generation apparatus 100 within the clock supply apparatus 603 generates clock signals in synchronization with higher-accuracy clock signals from the master clocks 608, 609 including the atomic oscillators using cesium.

The SDH apparatus 604 transmits and receives main signals based on the clock signals from the clock supply apparatus 603, and superimposes the E-series clock signals on the main signals and transmits the signals to the downstream clock supply apparatus 605. The clock supply apparatus 605 receives the clock signals from the clock supply apparatuses 601, 603 and generates clock signals in synchronization with the received clock signals.

The clock supply apparatus 605 normally generates clock signals in synchronization with the N-series clock signals from the clock supply apparatus 601. Then, when an abnormality occurs in the N-series, the clock supply apparatus 605 generates clock signals in synchronization with the E-series clock signals from the clock supply apparatus 603. By the switching from the N-series to the E-series, stable clock supply can be secured and reliability of the clock path network can be made higher. The SDH apparatus 606 transmits and receives main signals based on the clock signals from the clock supply apparatus 605. Similarly, the SDH apparatus 607 transmits and receives main signals based on the clock signals from the clock supply apparatus 605. Thereby, the apparatus of the C station can be synchronized with the apparatus of the A station or B station.

The frequency signal generation system 600 includes the frequency signal generation apparatus 100. Accordingly, in the frequency signal generation system 600, fluctuations of the partial pressure of the gas molecules contained in the buffer gas Gb can be suppressed.

Further, the frequency signal generation system 600 may be other various electronic apparatuses, communication systems, etc. than the clock transmission system. For example, the system may be a smartphone, tablet terminal, time piece, cell phone, digital still camera, liquid ejection device (e.g. inkjet printer), personal computer, television, video camera, video tape recorder, car navigation system, pager, personal digital assistance, electronic dictionary, calculator, electronic game machine, word processor, work station, videophone, security television monitor, electronic binoculars, POS terminal, medical device (e.g. electronic thermometer, sphygmomanometer, blood glucose meter, electrocardiographic measurement system, ultrasonic diagnostic system, electronic endoscope, or magnetocardiograph), fish finder, GNSS (Global Navigation Satellite System) reference frequency standard, various measuring instruments, meters and gauges (e.g. meters for automobiles, aircrafts, and ships), flight simulator, digital terrestrial broadcasting system, cell phone base station, or vehicle (automobile, aircraft, ship, or the like).

Part of the configurations of the invention can be omitted in the range having the features and advantages described in this application, and the respective embodiments and modified examples can be combined.

The invention includes substantially the same configurations (e.g. configurations having the same functions, methods, and results or configurations having the same purposes and advantages) as the configurations explained in the embodiments. Further, the invention includes configurations in which non-essential parts of the configurations explained in the embodiments are replaced. Furthermore, the invention includes configurations that offer the same advantages or configurations that achieve the same purposes as those of the configurations explained in the embodiments. Moreover, the invention includes configurations in which known techniques are added to the configurations explained in the embodiments.

What is claimed is:

1. A frequency signal generation apparatus comprising:
   a light source;
   an atom cell with a first gas enclosed therein through which light output from the light source passes, the first gas including gaseous alkali metal atoms and a buffer gas; and
   a container with a second gas enclosed therein and housing the atom cell, the second gas including the same gas as the buffer gas,
   wherein pressure of the buffer gas within the atom cell is substantially the same as that of the same gas within the container.

2. The frequency signal generation apparatus according to claim 1, wherein the second gas within the container contains first gas molecules having lower permeability for a wall of the atom cell than second gas molecules of the buffer gas, and
   total pressure of the second gas within the container is substantially the same as atmospheric pressure.

3. The frequency signal generation apparatus according to claim 2, wherein the buffer gas also contains the first gas molecules having lower permeability.

4. The frequency signal generation apparatus according to claim 1, wherein pressure of the buffer gas within the atom cell is lower than atmospheric pressure.

5. The frequency signal generation apparatus according to claim 1, wherein the second gas within the container contains a plurality of different gas molecules that are also contained within the buffer gas.

6. The frequency signal generation apparatus according to claim 1, further comprising a light receiving element that receives light transmitted through the atom cell,
   wherein the container houses the light source and the light receiving element.

7. The frequency signal generation apparatus according to claim 1, wherein the same gas and the buffer gas both include hydrogen, helium, neon, nitrogen, argon, or krypton.

8. A frequency signal generation system comprising a frequency signal generation apparatus, the frequency signal generation apparatus including:
   a light source;
   an atom cell with a first gas enclosed therein through which light output from the light source passes, the first gas including gaseous alkali metal atoms and a buffer gas; and
   a container with a second gas enclosed therein and housing the atom cell, the second gas including the same gas as the buffer gas,
   wherein pressure of the buffer gas within the atom cell is substantially the same as that of the same gas within the container.

* * * * *